(12) United States Patent
Fort et al.

(10) Patent No.: US 8,183,922 B2
(45) Date of Patent: May 22, 2012

(54) DIFFERENTIAL PAIR WITH CONSTANT OFFSET

(75) Inventors: Jimmy Fort, Aix en Provence (FR); Thierry Soude, Marseilles (FR); Michel Cuenca, Septemes-les-Vallons (FR); Florent Garcia, Fuveau (FR); Franck Strazzieri, Auriol (FR)

(73) Assignee: Atmei Rousset S.A.S. (FR)

( * ) Notice: Subject to any disclaimer, the term of this patent is extended or adjusted under 35 U.S.C. 154(b) by 0 days.

(21) Appl. No.: 12/620,351

(22) Filed: Nov. 17, 2009

(65) Prior Publication Data

US 2011/0115560 A1  May 19, 2011

(51) Int. Cl.
 *H03F 3/45* (2006.01)
(52) U.S. Cl. ......................................... 330/261; 330/254
(58) Field of Classification Search .................. 330/253, 330/254, 261
See application file for complete search history.

(56) References Cited

U.S. PATENT DOCUMENTS

| | | | | |
|---|---|---|---|---|
| 5,594,383 | A * | 1/1997 | Tamba | 327/552 |
| 6,369,652 | B1 * | 4/2002 | Nguyen et al. | 330/253 |
| 7,170,349 | B2 * | 1/2007 | Bhattacharjee et al. | 330/254 |
| 7,256,651 | B1 * | 8/2007 | Ziazadeh et al. | 330/253 |
| 7,301,391 | B2 * | 11/2007 | Jaussi et al. | 327/552 |
| 7,312,660 | B2 * | 12/2007 | Koh et al. | 330/260 |
| 7,400,203 | B2 * | 7/2008 | Ojo et al. | 330/305 |
| 7,501,892 | B2 * | 3/2009 | Otaka et al. | 330/254 |
| 7,525,381 | B2 * | 4/2009 | Murden et al. | 330/261 |
| 7,755,427 | B2 * | 7/2010 | Chen | 330/261 |
| 7,843,264 | B2 * | 11/2010 | Davierwalla et al. | 330/253 |

* cited by examiner

*Primary Examiner* — Henry Choe
(74) *Attorney, Agent, or Firm* — Fish & Richardson P.C.

(57) ABSTRACT

A bias current is generated for an unbalanced differential pair that is proportional to the transconductance gain of the differential pair. When the transconductance gain varies (e.g., due to temperature variations), the bias current varies in proportion thereby maintaining a constant offset voltage. In some implementations, a voltage to current converter circuit generates the bias current from a constant reference voltage that is independent of temperature and voltage supply variations (e.g., a bandgap reference voltage).

6 Claims, 3 Drawing Sheets

DIFFERENTIAL PAIR WITH CONSTANT OFFSET

TECHNICAL FIELD

This subject matter is generally related to electronics, and more particularly to compensating variations in unbalanced differential pairs.

BACKGROUND

An ideal operational amplifier amplifies the difference in voltages applied to its two input terminals. If the input voltages are equal, then the ideal output voltage of the amplifier is zero. In practical operational amplifiers, however, the output is often not zero due to an unbalanced differential pair in the operational amplifier. This non-zero output can be modeled as an offset voltage. If the offset voltage is constant over the operational range of the amplifier then compensation can be accomplished using another voltage of the same magnitude and opposite polarity. The offset voltage, however, depends on transconductance gain of the differential pair, and the transconductance gain can vary with changes in temperature. This can result in an offset voltage that is not constant.

SUMMARY

A bias current is generated for an unbalanced differential pair that is proportional to the transconductance gain of the differential pair. When the transconductance gain varies (e.g., due to temperature variations), the bias current varies in proportion thereby maintaining a constant offset voltage. In some implementations, a voltage to current converter circuit generates the bias current from a constant reference voltage that is independent of temperature and voltage supply variations (e.g., a bandgap reference voltage).

The disclosed implementations provide a fully integrated solution for a constant offset comparator, which can be manufactured at low cost, and which can potentially work at a low voltage supply (e.g., 1.2 volts).

DETAILED DESCRIPTION

Figure 1:
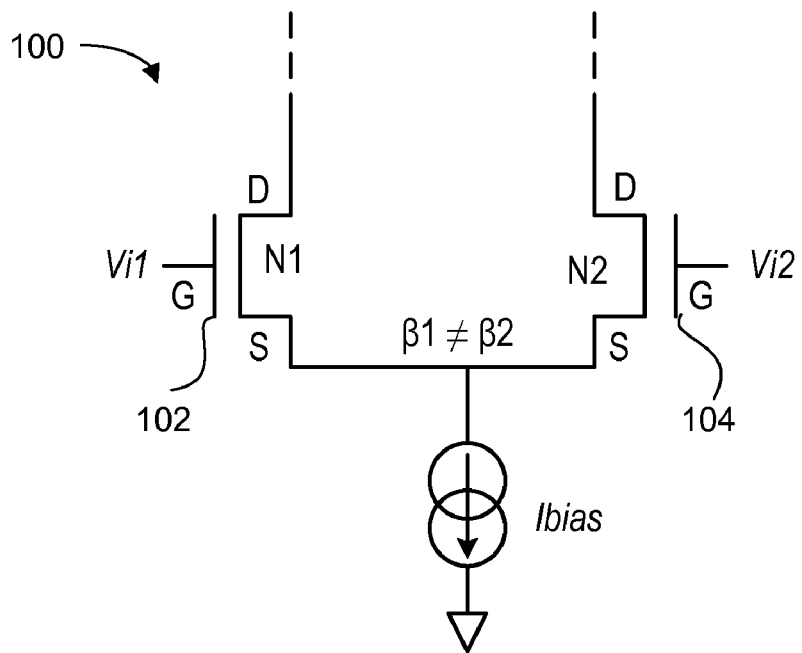
FIG. 1 is a schematic diagram of an example unbalanced differential pair.

FIG. 1 is a schematic diagram of an example unbalanced differential pair 100. In some implementations the differential pair 100 includes a pair of metal-oxide-semiconductor field-effect transistor (MOSFET) transistors 102, 104 (N1, N2) having their source terminals connected to a bias current source (Ibias). In the example shown, the transistors 102, 104 are n-channel MOSFET transistors.

The gate terminals of the transistors 102, 104 are connected to input voltages Vi1, Vi2, which can be the non-inverting and inverting inputs, respectively, of an operational amplifier. The transistors 102, 104 have transconductance gains β1 and β2, respectively. The transconductance gains are not equal (β1≠β2) in the unbalanced differential pair 100, resulting in a non-zero output voltage.

The transconductance gain β of a transistor is given by the relation below:

$$\beta = \kappa \cdot \frac{W}{L}, \quad [1]$$

where κ is a transconductance parameter, W is the channel width and L is the channel length of the transistor.

The offset of the differential pair 100 is given by the relation below:

$$os = \Delta V_{gs} = \sqrt{\frac{2Ibias}{\beta_1}} + V_t - \sqrt{\frac{2Ibias}{\beta_2}} - V_t, \quad [2]$$

where $\Delta V_{gs}$, is the difference between the gate-to-source voltages of the NMOSFET transistors 102, 104, $V_t$ is a threshold voltage of the NMOSFET transistors 102, 104 and β1 β2, are the transconductance gains of NMOSFET transistors 102, 104. The offset voltage, os, of [2] may not always be constant because transconductance gains β1, β2 can vary as a function of temperature. To obtain a constant offset voltage, os, the bias current Ibias should be proportional to the transconductance β of the differential pair. For a NMOSFET transistor, Ibias is given by the relations $$Ibias = \frac{\beta}{2} \cdot (V_{gs} - V_t)^2.$$

To make this current only proportional to β, a $V_{gs}$ equals to Vbg+Vt is imposed $$Ibias = \frac{\beta}{2} \cdot (V_{bg} + V_t - V_t)^2 = \frac{\beta}{2} \cdot V_{bg}^2 \quad [3]$$

For example, assuming that $$\beta 2 = K \cdot \beta 1 = \beta, \quad [4]$$

Combining [3], [4] and [2] gives, $$os = \Delta Vgs = V_{bg} \cdot (\sqrt{K} - 1) = \text{const.} \quad [5]$$

As can be observed from [5], os is a function of a constant bandgap voltage, Vbg, and K, where K is a ratio of β2 to β1 and is also constant. Thus, as temperature varies, Vbg and K remain substantially constant, resulting in the offset voltage remaining substantially constant.

Figure 2:
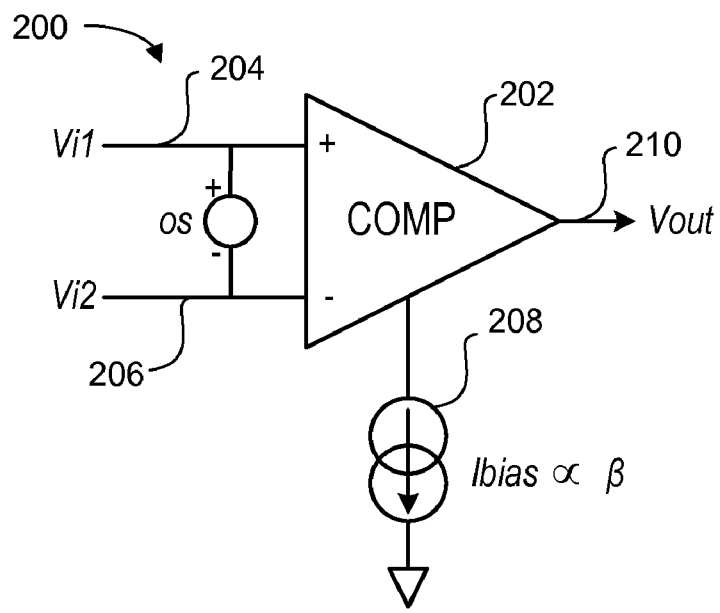
FIG. 2 illustrates an example compensation technique using bias current.

FIG. 2 illustrates an example compensation technique using bias current. An operational amplifier 200 includes non-inverting and inverting input terminals 204, 206 for receiving input voltages Vi1, Vi2, respectively. The output terminal 210 of the operational amplifier 200, provides a voltage output, Vout, which is often non-zero. This non-zero voltage output can be modeled as an offset voltage placed across the input terminals 204, 206. To maintain a constant offset voltage os, a bias current source 208 (Ibias), should be proportional to the transconductance gain, β.

Figure 3:
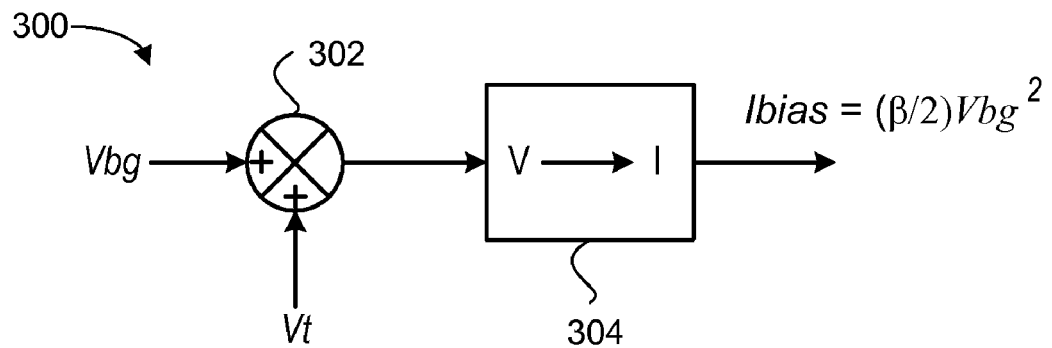
FIG. 3 illustrates a principal of bias current generation.

FIG. 3 is a block diagram illustrating a process 300 of bias current generation for compensating an unbalanced differential pair. In some implementations, a process 300 can include summing a bandgap voltage or other constant voltage and a threshold voltage of a transistor device (302) and converting the resulting voltage into a bias current (304). The resulting bias current is given by $$Ibias = \frac{\beta}{2} \cdot V_{bg}^2, \quad [6]$$

where β is the transconductance gain and Vbg is the bandgap voltage. As can be observed from [3], the Ibias is only proportional to β because the square of bandgap voltage is constant. The generation of Ibias is described below in reference to FIG. 4.

Figure 4:
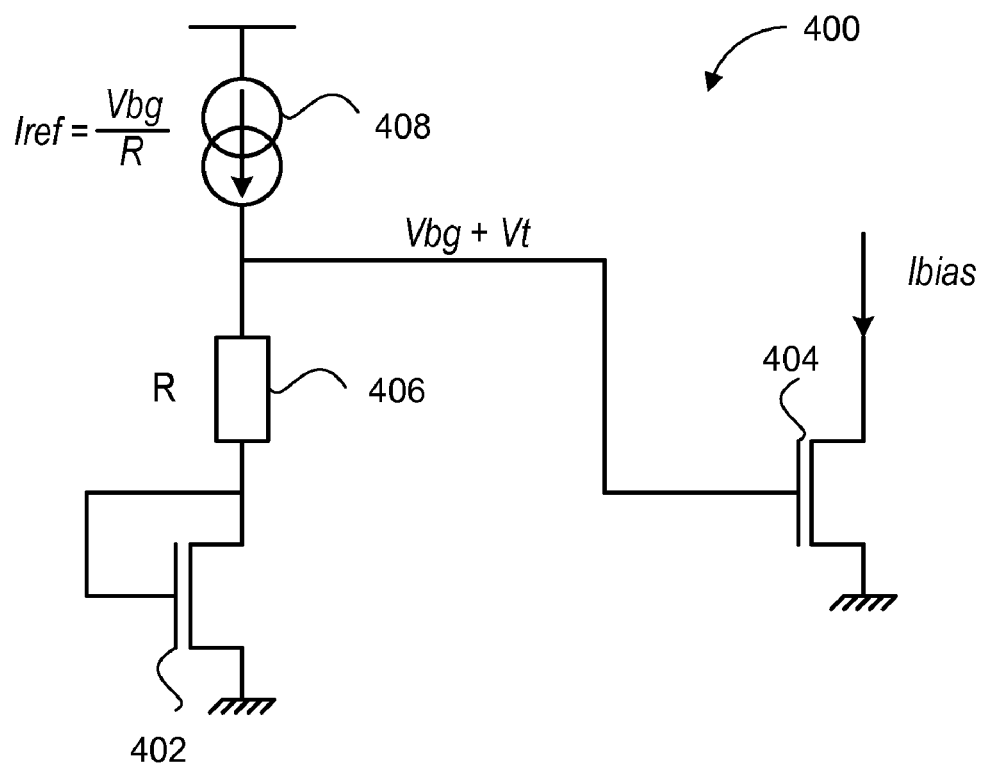
FIG. 4 is a schematic diagram of an example circuit for generating a bias current for compensating variations in an unbalanced differential pair.

FIG. 4 is a schematic diagram of an example circuit 400 for generating a bias current, Ibias, for compensating variations in an unbalanced differential pair (e.g., differential pair 100). This figure shows how to generate Vbg+Vt on the gate of the transistor 404. The transistor 402 operates in saturation region. In the example shown, a bandgap reference voltage, Vbg, is used. Circuits for generating bandgap reference voltages that are independent of voltage supply variations and temperature variations are known in the art and will not be described here.

When Vd=0 for transistor 402, for example by connecting the drain and gate terminals of the transistor 402 together as shown, then, Id, in the transistor 402 is a function of Vgs, and Iref sets the value of Vgs. The transistor 402 is sized to give Vgs=Vt. So, the gate of the transistor 404 is equal to $$Vt + R \cdot Iref = V_t + R \cdot \frac{V_{bg}}{R} = Vt + V_{bg}.$$

Since $$Ibias = \frac{\beta}{2} \cdot V_{bg}^2$$

and Vbg is constant, the circuit 400 generates a bias current, Ibias, that is proportional to β.

The example circuit 400 includes an example reference voltage supply circuit. The reference voltage supply circuit can comprise, for example, a first MOSFET transistor 402 having a gate terminal, a drain terminal and a source terminal, where the drain terminal and gate terminal are configured to have a drain-to-gate voltage of zero; and a resistive element 406 having a first end coupled to the drain terminal of the first MOSFET transistor 402 and a second end coupled to a reference current source 408, where the resistive element 406 and the reference current source 408 generate a reference voltage supply. The reference voltage supply can be, for example, equal to the sum of a bandgap voltage and a threshold voltage of the first MOSFET transistor 402. The reference voltage supply circuit can comprise, in another example, a first MOSFET transistor 402 having a gate terminal, a drain terminal and a source terminal, where the drain terminal and gate terminal are configured to have a drain-to-gate voltage of zero; and a reference current source 408 coupled to the drain terminal of the first MOSFET transistor 402, where the reference current source 408 includes a threshold-referenced or self-biased current source.

The example circuit 400 includes an example converter circuit coupled to the example reference voltage supply, the converter circuit operable for generating the bias current from a reference voltage supply generated by the reference voltage supply circuit. The converter circuit can comprise for example a second MOSFET transistor 404 having a gate terminal, a drain terminal and a source terminal, where the gate terminal is coupled to the reference supply voltage, the source terminal is coupled to ground voltage, and the drain terminal is coupled to the third terminals of the third terminals of transistors of a differential pair (e.g., as shown in FIG. 1 or FIG. 2.)

Figure 5:
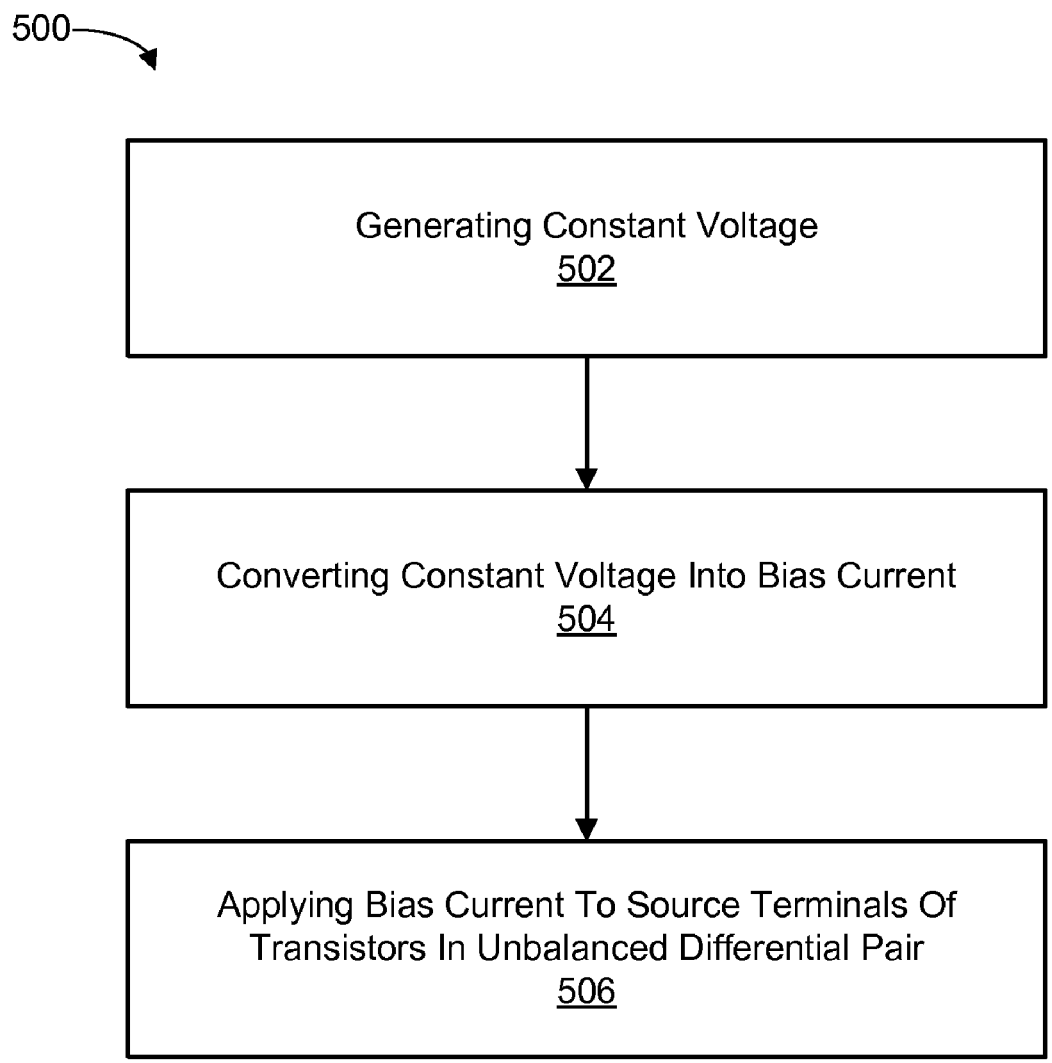
FIG. 5 is a flow diagram of a process for compensating variations in an unbalanced differential pair.

FIG. 5 is a flow diagram of a process 500 for compensating variations in an unbalanced differential pair. The process 500 can be performed using the circuits described in reference to FIGS. 1-4. In some implementations, the process 500 can include generating a constant reference voltage (502). For example, a bandgap reference voltage can be used. Generally, any circuit that can generate a reference voltage that is independent of voltage supply variations and temperature variations can be used. The constant voltage is converted to a current (504). The bias current is applied to the source terminals of the transistors of an unbalanced differential pair (506). The bias current is proportional to the transconductance gains of the transistors of the differential pair. If the transconductance gains vary due to temperature, the bias current varies in proportion resulting in a constant offset voltage. The compensations differential pair can be included in another circuit or device, such as an operational amplifier, as shown in FIG. 2.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A differential pair circuit, comprising:
    a pair of transistors, a first terminal of each transistor configured for coupling to an input voltage, a second terminal of each transistor configured for coupling to a load and a third terminal of each transistor for coupling to a current source, each transistor having a transconductance gain that varies as a function of temperature, where the transistors are MOSFET transistors and the first, second and third terminals are gate, drain and source terminals, respectively; and
    a current source circuit coupled to the third terminals of the transistors, the current source circuit configured for providing a bias current that varies as temperature varies in proportion to variations in transconductance gain of the transistors, where the current source circuit, further comprises:
        a reference voltage supply circuit; and
        a converter circuit coupled to the reference voltage supply, the converter circuit operable for generating the bias current from a reference voltage supply generated by the reference voltage supply circuit.

2. The circuit of claim 1, where the reference voltage supply circuit comprises:

a first MOSFET transistor having a gate terminal, a drain terminal and a source terminal, where the drain terminal and gate terminal are configured to have a drain-to-gate voltage of zero; and a resistive element having a first end coupled to the drain terminal of the first MOSFET transistor and a second end coupled to a reference current source, where the resistive element and the reference current source generate a reference voltage supply.

3. The circuit of claim 2, where the reference voltage supply is equal to the sum of a bandgap voltage and a threshold voltage of the first MOSFET transistor.

4. The circuit of claim 1, where the reference voltage supply circuit comprises:

a first MOSFET transistor having a gate terminal, a drain terminal and a source terminal, where the drain terminal and gate terminal are configured to have a drain-to-gate voltage of zero; and a reference current source coupled to the drain terminal of the first MOSFET transistor, where the reference current source includes a threshold-referenced or self-biased current source.

5. The circuit of claim 3, where the converter circuit comprises:

a second MOSFET transistor having a gate terminal, a drain terminal and a source terminal, where the gate terminal is coupled to the reference supply voltage, the source terminal is coupled to ground voltage, and the drain terminal is coupled to the third terminals of the transistors of the differential pair.

6. The circuit of claim 4, where the converter circuit comprises:

a second MOSFET transistor having a gate terminal, a drain terminal and a source terminal, where the gate terminal is coupled to the reference supply voltage, the source terminal is coupled to ground voltage, and the drain terminal is coupled to the third terminals of the transistors of the differential pair.

* * * * *

UNITED STATES PATENT AND TRADEMARK OFFICE
CERTIFICATE OF CORRECTION

PATENT NO.        : 8,183,922 B2
APPLICATION NO.   : 12/620351
DATED             : May 22, 2012
INVENTOR(S)       : Jimmy Fort et al.

It is certified that error appears in the above-identified patent and that said Letters Patent is hereby corrected as shown below:

On the Title Page, Inventors Item (75), Line 2: Delete "Marseilles" and insert -- Marseille --, therefor.

On the Title Page, Assignee Item (73), Line 1: Delete "Atmei" and insert -- Atmel --, therefor.

Column 2, Line 23, delete "β1" and insert -- β1, --, therefor.

Column 4, Lines 2-3, delete "comprise for example" and insert -- comprise, for example, --, therefor.

Signed and Sealed this
Twenty-fourth Day of July, 2012

David J. Kappos
*Director of the United States Patent and Trademark Office*